United States Patent
Nomura et al.

(10) Patent No.: US 6,188,605 B1
(45) Date of Patent: Feb. 13, 2001

(54) NON-VOLATILE SEMICONDUCTOR MEMORY USING SPLIT BIT LINES

(75) Inventors: Hidemi Nomura; Akira Yoneyama; Kunihiko Shibusawa, all of Osaka (JP)

(73) Assignee: Sanyo Electric Co., Ltd., Moriguchi (JP)

(*) Notice: Under 35 U.S.C. 154(b), the term of this patent shall be extended for 0 days.

(21) Appl. No.: 09/257,242

(22) Filed: Feb. 25, 1999

(30) Foreign Application Priority Data

Feb. 27, 1998 (JP) .................................................. 10-047573
Mar. 10, 1998 (JP) .................................................. 10-058360

(51) Int. Cl.[7] .................................................. G11C 16/04
(52) U.S. Cl. ................................ 365/185.11; 365/185.13; 365/63
(58) Field of Search ...................... 365/185.11, 185.12, 365/185.13, 185.29, 185.06, 51, 63

(56) References Cited

U.S. PATENT DOCUMENTS

| | | | |
|---|---|---|---|
| 5,029,130 | 7/1991 | Yeh ....................................... | 365/185 |
| 5,432,730 | * 7/1995 | Shubat et al. ........................... | 365/63 |
| 5,717,636 | * 2/1998 | Dallabora et al. ..................... | 365/185.13 |
| 5,748,538 | * 5/1998 | Lee et al. ............................. | 365/185.06 |
| 5,761,119 | * 6/1998 | Asano .................................. | 365/185.14 |

* cited by examiner

Primary Examiner—Son Mai
(74) Attorney, Agent, or Firm—Armstrong, Westerman, Hattori, McLeland & Naughton

(57) ABSTRACT

A first bit line BLa0 and a second bit line BLb0 are arranged for a single bit line BL0. A memory cell array is divided into a plurality of memory cell array blocks. On both opposite sides of the memory cell array 11, select transistors Q0, Q1 and Q4, Q5 and discharge transistors Q2, Q3 and Q6, Q7 are arranged. On the further outsides arranged are an electrode wiring 20 for applying a predetermined potential ARGBD and electrode wirings 21 and 22 for applying the control signals DCBLa and DCBLb. A plurality of units, each including the memory cell array block, the control transistors and control signals, are arranged. Main bit lines each passing through these units are extended so that they are connected to the select transistors of each unit pattern. In such a configuration, the capacitive load of bit lines owing to high integration of a non-volatile semiconductor memory is reduced, thereby realizing the high speed operation of the memory. In addition, an increase of the chip size can be prevented and easiness of a pattern layout can be assured.

13 Claims, 6 Drawing Sheets

NON-VOLATILE SEMICONDUCTOR MEMORY USING SPLIT BIT LINES

BACKGROUND OF THE INVENTION

1. Field of the Invention

The present invention relates to a non-volatile semiconductor memory using memory transistors each having a floating gate and a control gate.

2. Description of the Related Art

In an electrically erasable programmable ROM (EEPROM: Electrically Erasable Programmable ROM) with memory cells each composed of a single transistor, each memory cell is constructed of a transistor in a double gate structure having a floating gate and a control gate. In the case of such a transistor in a double gate structure, write of information is effected in such a manner that hot electrons injected from a drain region of the floating gate are accelerated toward a source region and passed through a gate insulating film so as to be injected into the floating gate. Read of the information is effected in such a manner that a difference in the operation of the memory transistors is detected according to whether or not charges have not been injected in the floating gate.

Such a memory structure can be roughly classified into two kinds of a "stack gate type" and a "split gate type". The memory cell in the split gate type is structured as shown in FIG. 5 in such a fashion that on a channel formed between a drain region 1 and source region 2, a floating gate 4 is partially superposed over the source region 2 through an insulating film 3 whereas a control gate 5 is superposed over the floating gate through an insulating film 6.

The drain region 1 serves a common region with an adjacent memory cell, and is connected to a bit line 8 through a contact hole 7. The source region also serves as a common region with the adjacent memory cell.

FIG. 6 shows the schematic structure of a non-volatile semiconductor memory using such split gate type memory cells. In a memory cell array 11 with a plurality of memory cells 10 arranged in a matrix with n rows and m columns, each memory cell 10 is located at each of crossing points of n word lines WL (0–n-1) and m bit lines BL (0–m-1). The control gate 5 of the memory cell 10 in FIG. 5 is connected to the word line WL, and the drain (region) 1 in FIG. 5 is connected to the bit line BL. The source 2 in FIG. 4 of the memory cell 10 in each row connected to adjacent word lines WL is connected to a common source line SL (0–n/2-1). For example, the memory cell connected both word lines WL0 and WL1 is connected to the common source line SL0. A row address decoder 12 selects one of the word lines WLs on the basis of an applied load address data RAD and also supplies a voltage to the selected word line WL according to each of signals ES, PG and RE indicative of an erase mode, program mode and read mode, respectively. The row address decoder 12 supplies a voltage according to each mode to the common source line SL relative to the selected word line W. A column address decoder 13 selects one of the bit lines BLs on the basis of an applied column address data CAD, and applies a voltage, which is controlled by a write/read control circuit 14, to the bit line BL selected in accordance with a program mode PG and a read mode signal RE.

On the other hand, in order to prevent discharge of the bit line in the erase and read modes and erroneous write in the program mode, between each bit line BL and a potential line ARGND, an MOS transistor 15 is arranged which is controlled by each of the inverted signals *Y0 to *Ym-1 of the decode outputs from the column address decoder 13. For example, if the bit line BL0 is selected as a result that the column address data CAD has been decoded in the read mode and program mode, the decode output *Y0 is at a "L" level and the other decode outputs *Y1 to *Ym-1 are at an "H" level. Thus, the other bit lines BL1 to BLm-1 than the selected bit line BL0 are connected to the potential line ARGND through the MOS transistors 15 which have turned "ON".

Referring to FIGS. 5 and 6, an explanation will be given of the erase mode, program mode and read mode of the non-volatile semiconductor memory.

(1) Erase Mode

When the erase mode signal ES becomes active, the row address decoder 12 applies an erase voltage Ve (e.g. 14.5 V) to the word line (e.g. WL0) selected on the basis of the address data RAD, and applies a ground potential (0 V) to the other non-selected word lines WL1 to WL. The row address decoder 12 also applies the ground potential to all the common source lines SL0–SLn/2-1.

On the other hand, the column address decoder 13 places all the decode inverted outputs *Y0–*Ym-1 at the "H" level so that the all the MOS transistors 15 are "ON". Thus, all the bit lines BLs are connected to the potential line ARGND. At this time, since the potential line ARGND is at a grounding potential, all the bit lines BLs are in a state where the grounding potential is applied to them. Thus, an erase voltage of 14.5 V is applied to the control gates 5 of all the memory cells connected to the word line WL0, and a voltage of 0 V is applied to the drains 1 and source 2 thereof. In the memory cell 10, in which the capacitive coupling between the sources 2 and floating gate 4 is much larger than that between the control gate 5 and floating gate 4, the potential of the floating gate 4 is fixed to the same 0 V as the source 2 by the capacitive coupling, and the potential difference of 14.5 V is created between the control gate 5 and floating gate 4. Thus, the F-N (Fowler-Nordheim) tunnel current flows through a tunneling oxide film (6a in FIG. 4). Namely, the electrons which have been injected into the floating gate are extracted from the protruding portion of the floating gate 4 into the control gate 5. Accordingly, the batch erase of the memory cells connected to the one word line W1 can be implemented.

(2) Program Mode (Write Mode)

When the program mode signal PG becomes active, the row address decoder 12 applies a select voltage Vgp (e.g. 2 V) to the word line (e.g. WL0) selected on the basis of an applied row address data RAD, and applies a grounding potential of 0 V to the other non-selected word lines WL1–WLn-1. The row address decoder 12 supplies a program voltage Vp (e.g. 12.2 V) to the common source line SL0 relative to the selected word line WL0. On the other hand, the column address decoder 13 connects the bit line BL (e.g. BL0) selected on the basis of the column address data CAD to a read/write circuit 14. Therefore, the voltage based on the write data applied to an input/output terminal I/O is applied to the selected bit line BL0. For example, if "0" is applied to the input/output terminal I/O, a write enable source voltage Vse (0.9 V) is applied to the bit line BL0. If "1" is applied to the input/output terminal I/O, a write disable source voltage Vsd (4.0 V) is applied to the bit line BL0. The other non-selected bit lines BL1 to BLm-1 are connected to the potential line ARGND set at the write disable source voltage Vsd (4.0 V).

Thus, in the memory cell 10 specified by the word line WL0 and bit line BL0, when the input/output terminal I/O is "0", 12.2 V is applied to the source 2, 0.9 V is applied to the drain 1 and 2.0 V is applied to the control gate 5. As a result, although carries flow from the drain 1 to the source 2, the potential at the floating gate 4 is approximately equal to that at the source 2 because of the capacitive coupling therebetween. Therefore, the carries are injected as hot electrons into the floating gate 4 through the insulating film 3. On the other hand, in the non-selected memory cells 10, since the voltages at the drain 1, source 2 and control gate 5 do not satisfy the programming condition, injection of the carries into the floating gate 4 does not occur.

(3) Read Mode

When the read mode signal RE is active, the row address decoder 12 applies a selecting voltage Vgr (4.0 V) to the word line WL (e.g. WL0) selected on the basis of a row address data RAD, and also applies a grounding voltage (0 V) to all the common source lines SL . . . On the other hand, the column address decoder 13 connects the bit line BL (e.g. BL0) selected on the basis of a column address data CAD to the write/read circuit 14. The read of data held in the memory cell 10 specified by the word line W0 and the bit line BL0 is effected. On the other hand, the non-selected bit lines BL1–BLm-1 are connected to the potential line ARGND held at the grounding potential (0 V) through the MOS transistors 15. Thus, when the column address is shifted, the initial state of read of the other bit lines BL is biased from 0 V by the write/read circuit 14, thereby preventing the erroneous operation of read. As described above, in each mode, a predetermined voltage is selectively applied to the word lines WLs, bit lines BLs and common source lines SLs so that the erasing, programming or reading conditions can be satisfied. Additionally, in the stand-by mode other than the modes described above, all the MOS transistors are "ON" so that all the bit lines are connected to the potential line ARGND set at the grounding potential 0 V and hence discharged to 0 V.

As the degree of miniaturization advances with a progress of a semiconductor manufacturing technique, the non-volatile semiconductor memory as shown in FIG. 6 has increased its storage capacity as 16 M bits, 32 M bits and further 64 M bits. This has increased the parasitic capacitance abruptly. Specifically, since junction capacitances of the drains 1 are connected in parallel to a single bit line BL, if the number of the memory cells 10 becomes twice or four times, the parasitic capacitance also becomes twice or four times. This increases the load of the write/read circuit and lengthens the write time and read time. Further, this lengthens the time required for the bit lines to be discharged (or precharged) to a predetermined voltage by connecting the bit lines BLs to the potential line ARGND through the MOS transistors 15. As a result, the operation speed of the non-volatile semiconductor memory is reduced and its characteristic is deteriorated.

SUMMARY OF THE INVENTION

An object of the present invention is to provide an non-volatile semiconductor memory which can reduce the capacitive load of bit lines owing to the high integration of the memory to realize its high speed operation, and can also prevent an increase in its chip size and make the pattern layout with ease.

In order to attain the above object, first, in a semiconductor memory cell array including a plurality of non-volatile memory cells connected to a plurality of word lines and a plurality of bit lines, a row decoder for selecting the word lines on the basis of a row address data, and a column decoder for selecting the bit lines on the basis of a column address data, the present invention is characterized in that the memory cell array is provided with a plurality of main bit lines connected to said column address decoder, a plurality of split bit lines each connected to each of said plurality of main bit lines and a plurality of select transistors to determine which of the split bit line is to be selected. In this configuration, since the split bit lines can be selectively connected to the column address decoder, the capacitive load of a write/read circuit can be reduced.

Secondly, a unit pattern is composed of select transistors, discharge transistors and electrode wirings arranged on both opposite sides of the memory cell array. A plurality of the unit patterns are arranged in a repetitive manner, and the main bit lines are extended over said unit patterns so that they are connected to the select transistor of each of the unit patterns. In this way, without increasing the chip size, the layout of the non-volatile semiconductor memory can be realized.

The above and other objects and features of the present invention will be more apparent from the following description taken in conjunction with the accompanying drawings.

DESCRIPTION OF THE PREFERRED EMBODIMENTS

Figure 1:
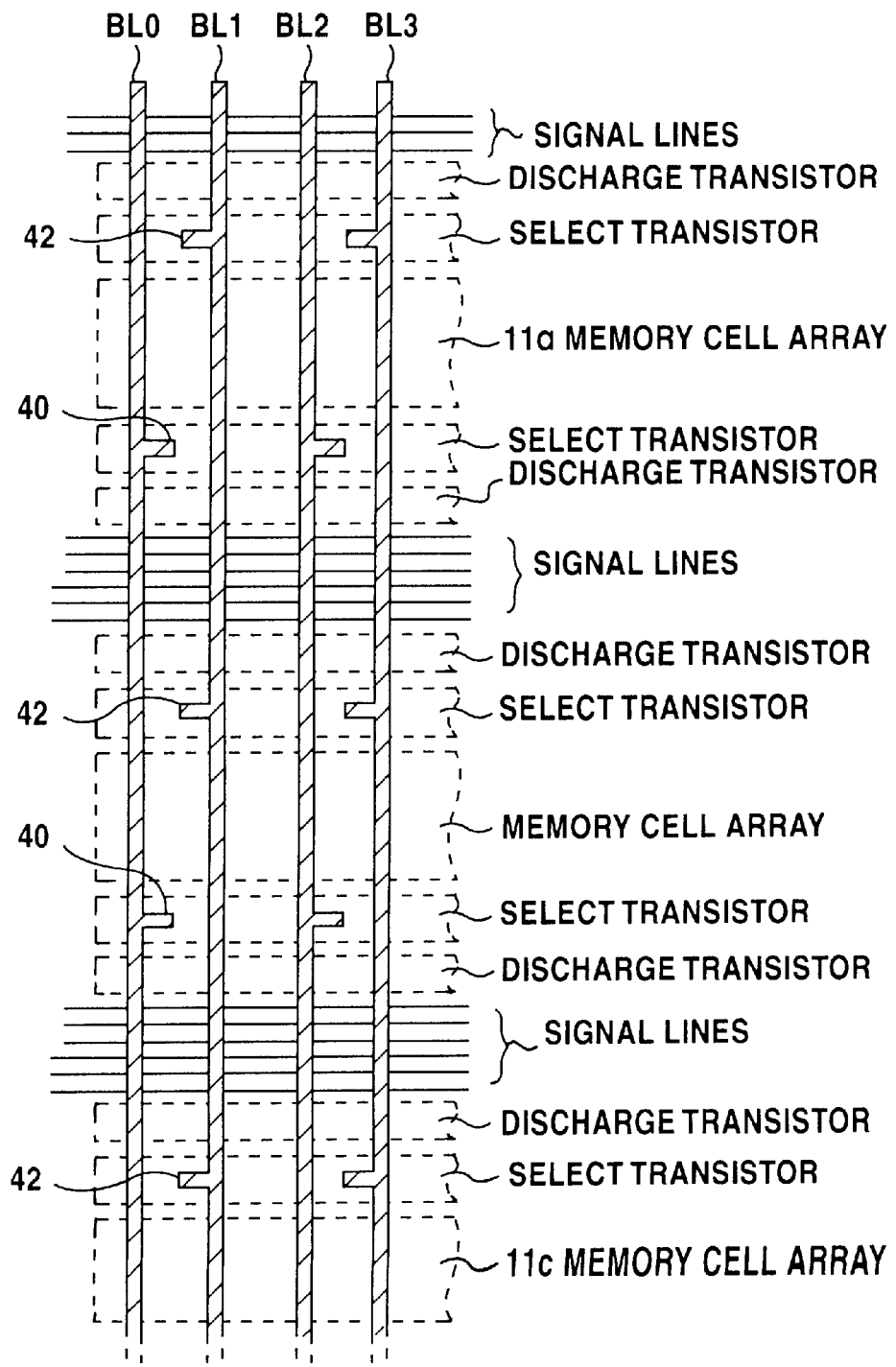
FIG. 1 is a plan view showing a schematic configuration of a memory according to an embodiment of the present invention.
Figure 2:
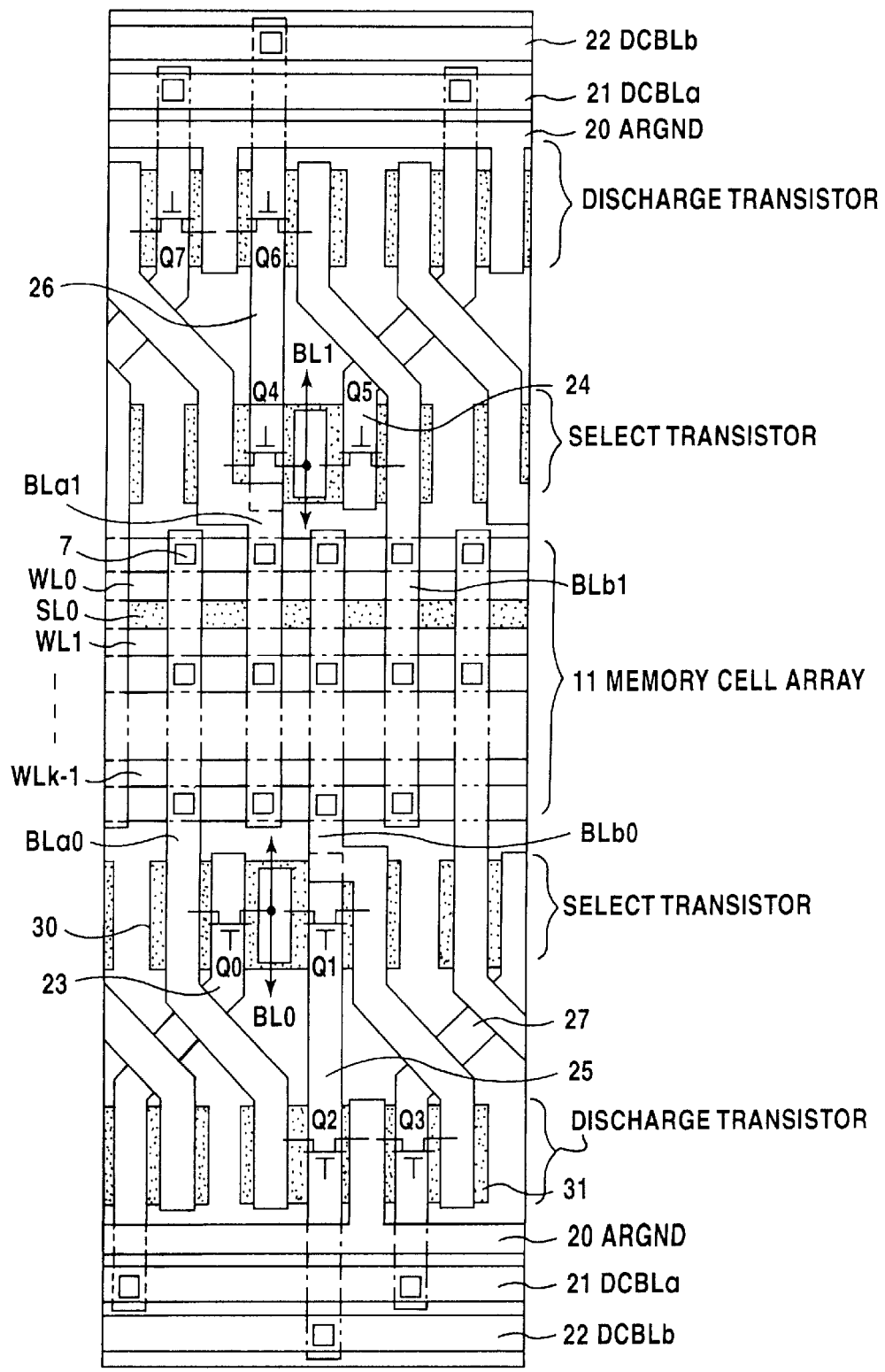
FIG. 2 is a plan view of a pattern layout of a memory cell array portion.
Figure 3:
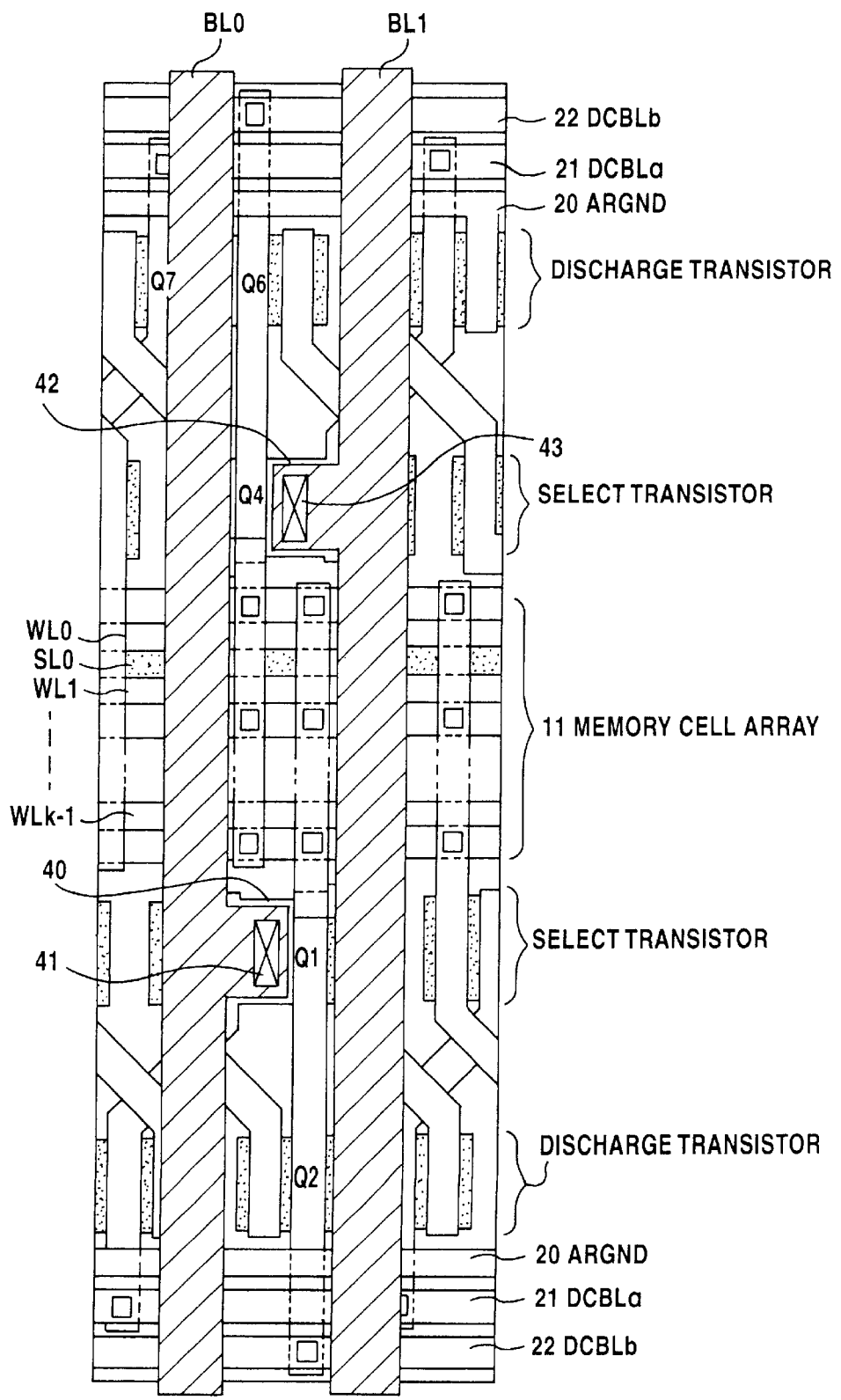
FIG. 3 is a plan view of a pattern layout of the main bit lines of the memory cell array.

FIG. 1 is a plan view showing a schematic configuration of a memory according to an embodiment of the present invention; FIG. 2 is a plan view of a pattern layout of a memory cell array portion; FIG. 3 is a plan view of a pattern layout of the main bit lines of the memory cell array; and FIG. 4 is a circuit diagram showing a circuit diagram according to the embodiment of the present invention.

Figure 4:
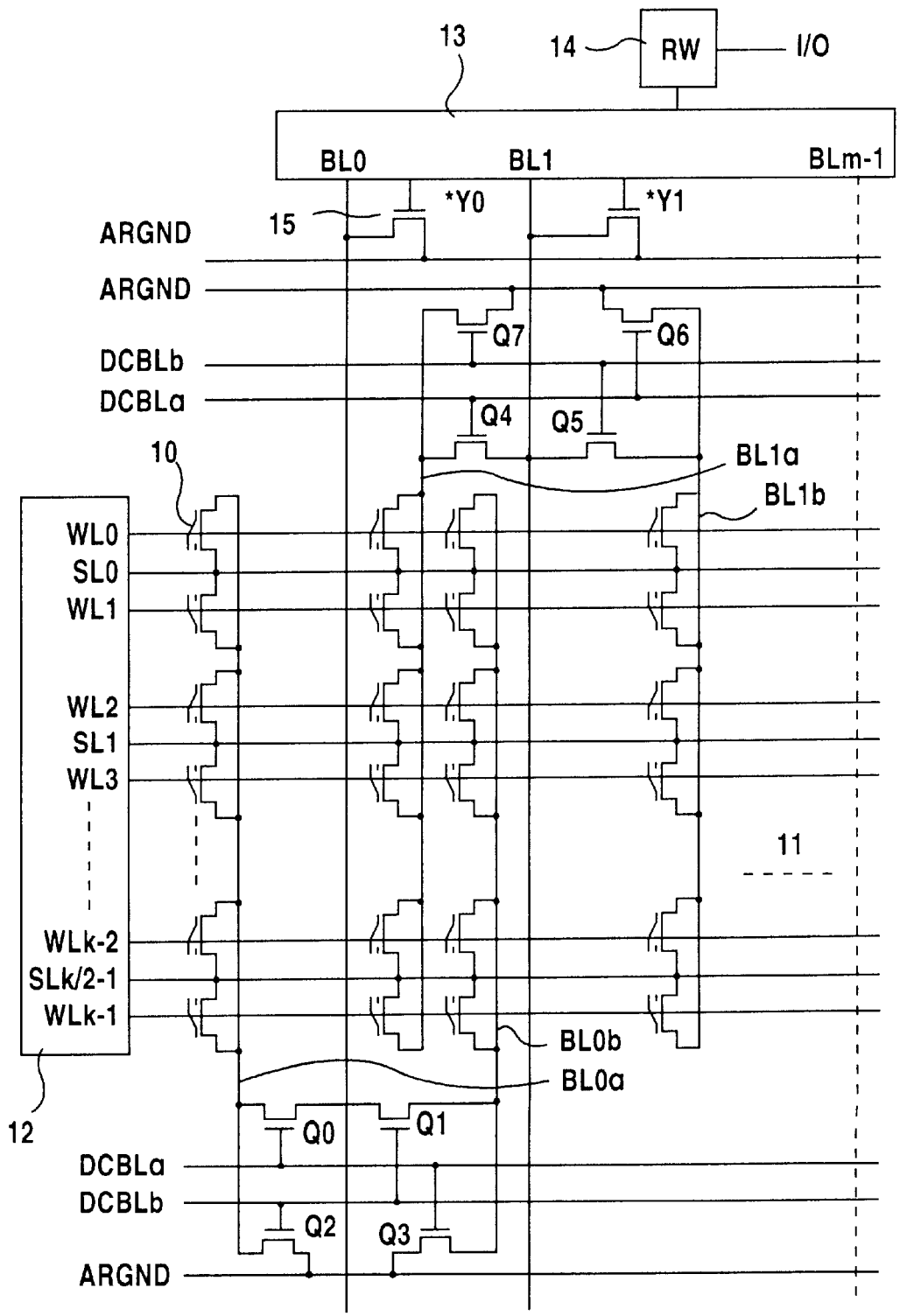
FIG. 4 is a circuit diagram showing a circuit diagram according to the embodiment of the present invention.
Figure 6:
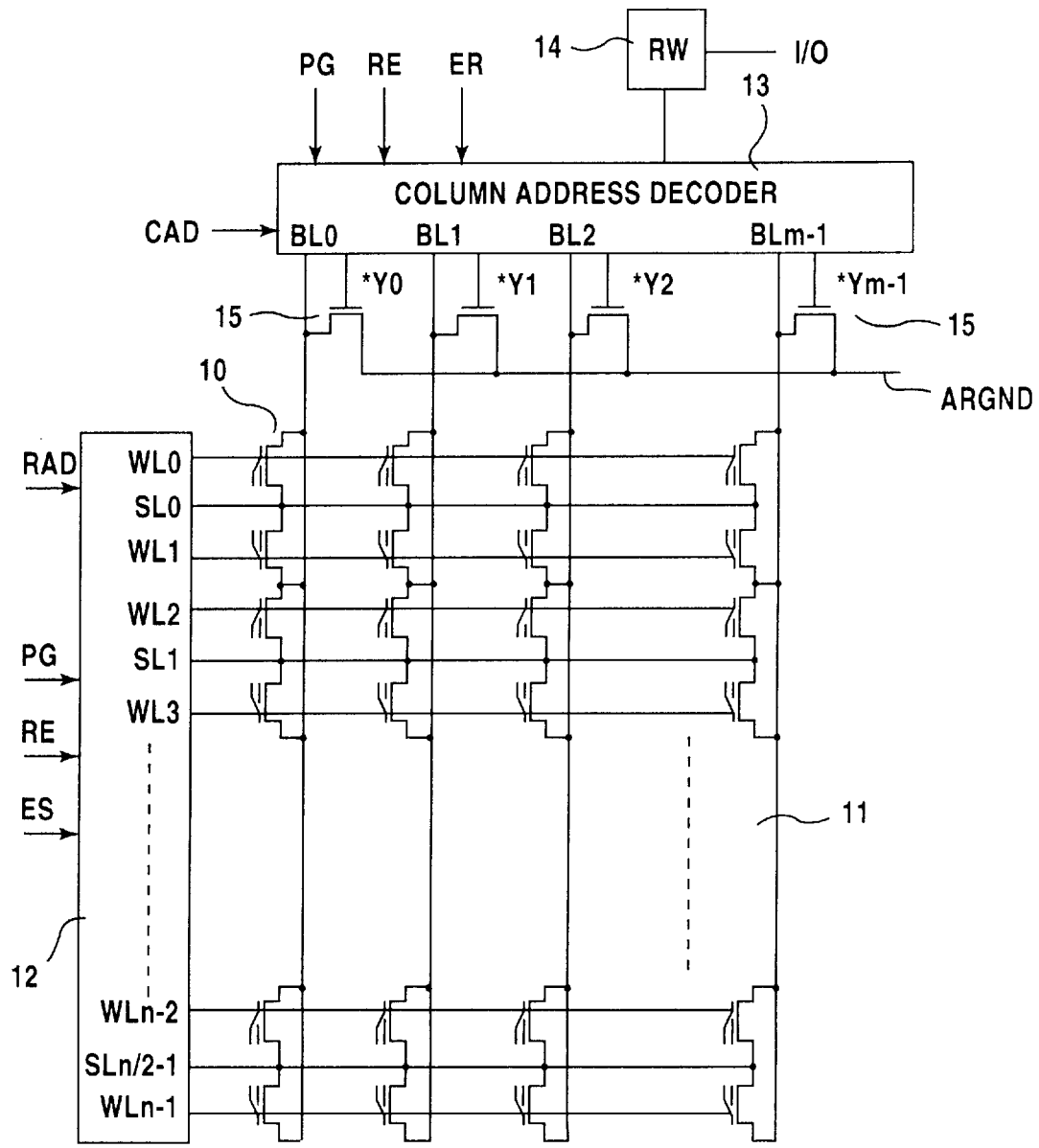
FIG. 6 is a circuit diagram showing a prior art.

In FIG. 4, a row address decoder 12, column address decoder 13 and write/read circuit 14, which are substantially equivalent to the corresponding components in FIG. 6, will not be explained.

The memory cell array is composed of memory cells 10 arranged in a matrix with k rows and 2m columns. The memory cell array is provided with word lines WL0–WLk-1, and common source lines SL0–SLk/2-1. The memory cell array is also provided with main bit lines of BL0–BLm-1 extending from the column address decoder 13.

The main bit lines BL0–BLm-1 are each provided with two split bit lines of first split bit line BLa0–BLam-1 and second split bit line BLb0–BLbm-1. The memory cell array is separated into two blocks of a first cell array block connected to the first split bit lines BLa0–BLam-1 and a second cell array block connected to the second split bit lines BLb0–BLb-1. As a result, the split bit lines the number of which is twice as many as that of the m main bit lines BL0–BLm-1.

First select transistors Q0, Q4, each controlled by a control signal DCBLa, are arranged between the first bit lines BLa0–BLam-1 and the main bit lines BL0–BLm-1. Select transistors (first discharge transistors) Q2, Q7, each controlled by a control signal DCBLb, are arranged between the first split bit lines BLa0–BLam-1 and the potential line ARGND. Likewise, second select transistors Q1, Q5, each controlled by a control signal DCBLb, are arranged between the second split bit lines BLb0–BLam-1 and the main bit lines BL0–BLm-1. Select transistors (second discharge transistors) Q3, Q6, each controlled by a control signal DCBLb, are arranged between the second split bit lines BLb0–BLbm-1 and the potential line ARGND.

The control signals DCBLa and DCBLb are supplied from a row address detecting circuit (not shown) in accordance with the contents of a row address data RAD. Specifically, the control signal DCBLa is a signal which is at an "H" level when the address data is directed to select the first cell array block connected to the first split bit lines BLa0–BLam-1. The control signal DCBLB is a signal which is at the "H" level when the address data is directed to select the second cell array block connected to the second split bit lines BLb0–BLbm-1. Therefore, when the control signal DCBLa becomes the "H" level, the select transistors Q0 and Q3 become "ON" so that the first split bit line BLa0 is connected to the main bit line BL0 and the second split bit line BLb0 is connected to the potential line ARGND. On the other hand, when the control signal DCBLb is the "H" level, the result of connection is quite the reverse to the above case.

In this embodiment, the potential relationship of the memory cell array 11 in each of the operation modes (erase mode, program mode, and read mode), which is the same as the prior art, is not explained here. The control signals DCBLa and DCBLb are inverted signals from each other, i.e. complementary signals to each other. Therefore, either of the split bit lines BLa0 or BLb0 is connected to the main bit line BL0 whereas the other is connected to a predetermined potential through the ARGND wiring so that a specific cell is selected in the memory cell array. Such an operation is different from the prior art. Further, in the other stand-by mode than each of the operation modes, for the purpose of prevention of the erroneous operation and abrupt transition to the subsequent mode, all the bit lines of the memory cell arrays must be discharged to the grounding potential. Therefore, the control signals DCBLa and DCBLb are placed at the "H" level and all the outputs *Y from the column address decoder 13 are placed at the "H" level. Thus, the select and discharge transistors Q0–Q7 are all "ON" so that the main bit line BL, the split bit lines BLa, BLb are connected to the potential line ARGND set at the grounding potential and discharged.

Figure 5:
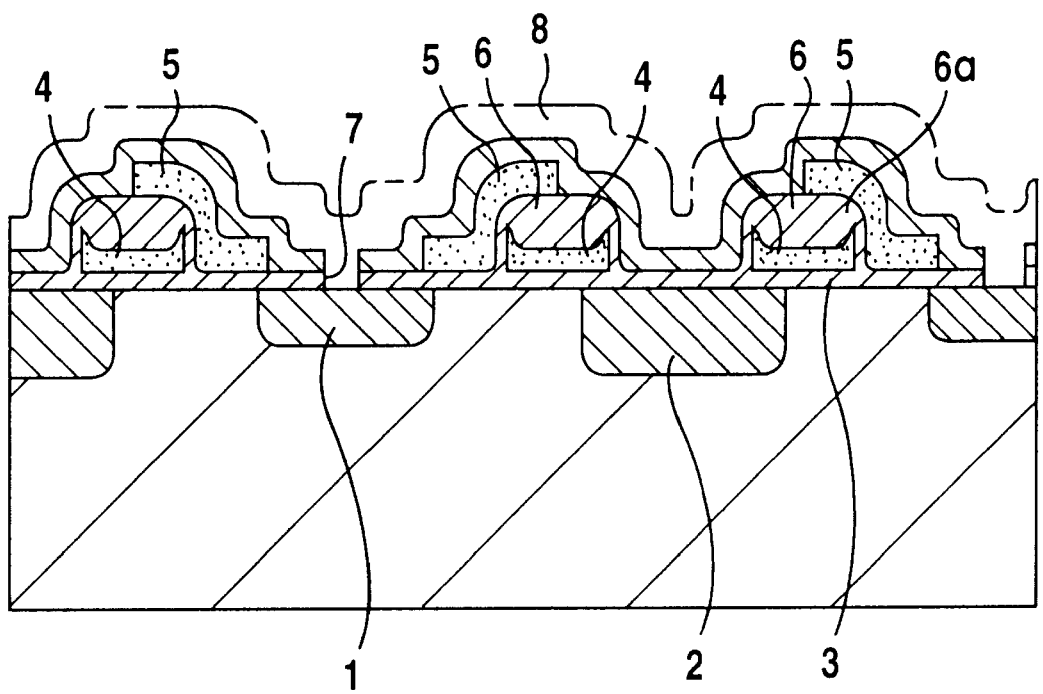
FIG. 5 is a sectional view showing a cell structure of a non-volatile memory.

FIG. 2 is a plan view of the pattern layout of an integrated circuit device implementing the above circuit configuration. A memory cell array 11 arranged in the vicinity of the center of the drawing is composed of memory cells 10 each of which is a floating gate-type flash memory element as shown in FIG. 5. Specifically, the control gate of the memory element is extended to constitute the word lines WL0–WLk-1, and the source region extends over each memory cell to constitute the common source lines SL0–SLk-1. The first and second split bit lines BLa0–BLam-1 and BLb0–BLbm-1 are connected to the drain region 1 of each memory cell 10 through the contact hole 7.

On both sides (upper and lower sides in FIG. 2) of the memory cell array 11, the select transistors Q0, Q1 and Q4, Q5 are arranged. On the further outsides, the discharge transistors Q2, Q3 and Q6, Q7 are arranged. On the further outsides arranged are an electrode wiring 20 for applying a predetermined potential ARGBD and electrode wirings 21 and 22 for applying the control signals DCBLa and DCBLb. A unit is composed of the first, second split bit lines BLa0, BLb0, a pair of select transistors Q0, Q1, and a pair of discharge transistors Q2, Q3. The plurality of such units are formed in substantially the same repetitive pattern. In order to form symmetrical patterns with respect to the memory cell array 11, another unit, which is composed of the other two split bit lines BLa1, BLb1, a pair of select transistors Q4, Q5 and a pair of discharge transistors Q6, Q7, is arranged on the opposite side to the above unit. Further, the first and second bit lines BLa0, BLb0 relative to the main bit line BL0 are extended from the lower side of the drawing where the select transistors Q0, Q1 are located to the upper side of the drawing where the select transistors Q4, Q5 are located. On the other hand, the first and second split bit lines BLa1 and BLb1 relative to the adjacent main bit line BL1 are extended from the upper side of the drawing to the lower side. These split bit lines are alternately staggered in a such a fashion that subsequent to the first split bit line BLa0 relative to the main bit line BL0, the first split bit line BLa1 relative to the adjacent main bit line BL1 is located. In short, the split bit lines are arranged in parallel at regular intervals in the order of BLa0, BLb0, BLa1, BLb1, . . . . Such an alternate arrangement permits the select and discharge transistors, each having a larger pattern size than the cell pitch of the memory cell array 11, to be accommodated within a range of the cell pitch.

The select transistors Q0, Q1 and Q4, Q5 are each constructed of an MOS transistor composed of two gate electrodes and a common source (or drain) located on a common active region 30 (sand-like painted in the figure) encircled by an LOCOS oxide film. The common source (or drain) is connected to the main bit line BL0, BL1 indicated by a bidirectional arrow, which is connected to the column address decoder 13. In this embodiment, the select transistors Q0 and Q1 arranged on the lower part of the memory cell array are connected to the main bit line BL0, whereas the select transistors Q4 and Q5 arranged on the upper part thereof are connected to the main bit line BL1.

The discharge transistors Q2, Q3 and Q6, Q7 are each constructed of an MOS transistor composed of two gate electrodes and a common source (or drain) located on a common active region 31 (sand-like painted in the figure) encircled by an LOCOS oxide film. The common source (or drain) is connected to an electric wiring 20 to which a predetermined potential ARGND is applied. The select transistors Q0, Q1 and the discharge transistors Q2, Q3 are arranged so that their active regions 30, 31 are staggered from each other.

The first split bit line BLa0 relative to the main bit line BL0 is connected to the drain (or source) of the select transistor Q0 through a contact hole, and in addition, it is extended aslant at an angle of about 45° and connected to the drain (or source) of the discharge transistor Q2 through the contact hole. The second split bit line BLb0, which makes a pair with the first split bit line BLa0, is connected to the drain (or source) of the select transistor Q1, and in addition, it is extended aslant in parallel to the first split bit line BLa0 and connected to the drain (or source) of the discharge transistor Q3. Likewise, the first split bit line BLa1 relative to the main bit line BL1 is connected to the select transistor Q4 and the discharge transistor Q7, whereas the second split line BLb1 is connected to the select transistor Q5 and discharge transistor Q6.

The gate electrode wiring 25 of the select transistor Q1 is extended straight on the chip to constitute a gate electrode of the disharge transistor Q2, and is further extended to be connected to the wiring 22 of the select signal DCLBb through the through hole. The gate electrode wiring 25 is constructed of a polysilicon wiring layer continuously extending from the gate electrode of the transistor Q1, Q2. Likewise, the gate electrode wiring 23 of the select transistor Q0 is extended orthogonally to the area extending aslant of the first split bit line BLa0 to constitute the gate electrode of the discharge transistor (corresponding to Q3) relative to an adjacent main bit line, and connected to the wiring 21 of the select signal DCBLa. The gate electrode wiring 23 is also constructed of the polysilicon wiring layer continuously extending from the gate electrode of the transistors Q0, Q3. Incidentally the first split bit line BLa0 and the gate electrode wiring 23, and the second split bit line BLb0 are insulated from each other by interlayer insulation and cross each other.

The transistors are formed in a successive repetitive pattern. Therefore, the gate electrode wiring 27 of the discharge transistor Q3 constitutes the gate electrode wiring (corresponding to the second gate wiring 23) of the select transistor (corresponding to the select transistor Q0) relative to the adjacent main bit line. The gate electrode wiring 26 of the select transistor Q4 is connected to the gate electrode of the discharge transistor Q6, whereas the gate electrode wiring 24 of the select transistor Q5 is connected to the gate electrode of the discharge transistor relative to the adjacent bit line. Such connections are made to provide a symmetrical pattern with respect to the memory cell array 11.

The signals 20, 21 and 22 arranged on both sides of the memory cell array 11 are electrically connected to the corresponding electrodes, and the same signal to the memory cell arranged in the vicinity of the center of the drawing.

FIG. 3 is a plan view of the pattern layout of main bit lines BL0 and BL1. The main bit lines BL0 and BL1 are constructed of electrode wirings which are inter-layer insulated from the split bit lines BLa0–BLam-1 and BLb0–BLbm-1 and are extended in parallel to these split bit lines so as to transmit the informations. A convex area 40 extended from the electrode of the main bit line BL0 is provided over the common source (or drain) of the select transistors Q0, Q1, and the main bit line BL0 is connected to the common source (or drain) of the select transistors Q0, Q1 through a through-hole 41 formed below the convex area 40. Likewise, a convex area 42 extended from the electrode of the main bit line BL1 is provided over the common source (or drain) of the select transistors Q4, Q5, and the main bit line BL1 is connected to the common source (or drain) of the select transistors Q4, Q5 through a through-hole 43 formed below the convex area 42. In this case, the convex area 40 of the main bit line BL0 and the convex area 42 of the main bit line BL1 stand opposite to each other.

FIG. 1 is a plan view of a schematic configuration of a large number of unit patterns each consisting of a pattern shown in FIGS. 2 and 3. A plurality of memory cell arrays 11a, 11b and 11c are arranged so that signal lines (electrodes 20, 21 and 22) are adjacent thereto, respectively. The main bit lines BL0, BL1, BL2, BL3, . . . are extended to pass through the memory cell arrays 11a, 11b, 11c thus arranged. For example, the main bit line BL0 is connected to the select transistors, which are provided below each of the memory cell arrays 11a, 11b and 11c in the figure, at the convex area 40. The main bit line BL1 is connected to the select transistors, which are provided above each of the memory cell arrays 11a, 11b and 11c in the figure, at the convex area 42. In this case, in each unit pattern, the convex areas 40 of the main bit line BL0 and the convex areas 42 of the main bit line BL1 are extended to be opposite to each other. In a fashion of similar couplings, the main bit lines BL2, BL3, . . . are arranged repetitively.

The single memory cell array 11 is divided into two blocks. And a plurality of memory cell arrays 11 are arranged in parallel. The entire arrangement of the of the memory cell arrays can be divided into blocks whose number is twice as many as the number of the arranged memory cell array blocks. In this case, for the memory cell array 11b, control signals DCBLc and DCBLd are caused to correspond to the control signals DCBLa and DCBLB, and for the memory cell array 11c, control signals DCBLe and DCBLf are caused to correspond to the control signals DCBLa and DCBLB. These control signals serve as complementary signals to each other. When the memory cell array 11a is selected in accordance with a row address data RAD, the control signals DCBLc and DCBLd and the control signals DCBLe and DCBLf are placed at an "L" level so that the memory cell arrays 11b and 11c are in a floating state. When the memory cell array 11b are selected, the control signals DCBLc and DCBLd are placed at an "H" level whereas the control signals DCBLa and DCBLb and the control signals DCBLe and DCBLf are placed at the "L" level.

As described above, the first and second split bit lines BLa and BLb in a divided cell array block is connected to the main bit line BL of the column address decoder 10 only when the pertinent cell array block is selected. For this reason, the capacitive load of the write/read circuit 14 will be reduced. The split bit lines in the cell array block not selected are connected to the potential line ARGND through the discharge transistors. For this reason, the initial value when the pertinent cell array block is selected is fixed, thereby preventing an erroneous operation. Further, since the voltage applying condition in each of the modes (read, write and erase) can be satisfied by low capacitive load, the high speed operation of the non-volatile memory can be realized.

Further, the respective transistors and control signal lines required to select either the split bit line BLa or BLb can be arranged without increasing the cell pitch of the memory cells in such a fashion that they are arranged on both sides of the memory cell array 11.

Further, the number of the cell array blocks can be increased in such a fashion that a large number of unit patterns each shown in FIGS. 2 and 3 are arranged in parallel. In this case, since the main bit lines BL0, . . . are extended over these cell array blocks, the split bit lines for each unit pattern can be selected.

The arrangement distance between the adjacent bit lines can be shortened in such a manner that the convex portions of the main bit lines are arranged oppositely to each other.

What is claimed is:

1. A non-volatile semiconductor memory comprising:
a memory cell array including a plurality of non-volatile memory cells, and connected to a plurality of word lines and a plurality of bit lines, respectively;
a row decoder for selecting said word lines on the basis of row address data; and
a column decoder for selecting said bit lines on the basis of column address data; wherein
said bit lines include a plurality of main bit lines connected to said column decoder and a plurality of split bit lines each connected to each of said plurality of main bit lines through each of a plurality of select transistors to determine which of the split bit lines is to be selected; and the split bit lines connected to a first main bit line and a second main bit line arranged adjacently thereto are arranged alternately adjacent to each other, wherein two split bit lines are connected to each of said main bit lines, and wherein the select transistors connected to said first main bit line and said second main bit line are arranged at opposite ends of the memory cell array so as to sandwich each one of said plurality of non-volatile memory cells.

2. A non-volatile semiconductor memory according to claim 1, further comprising a plurality of discharge transistors for connecting said split bit lines to a discharge potential.

3. A non-volatile semiconductor memory according to claim 1, wherein said memory cell array is divided into a plurality of memory cell array blocks, and said select transistor selectively connects any split bit line for each block to said column decoder through the main bit line;

said select transistor and an electrode wiring for applying a control signal to said select transistor are arranged to be opposite to each other in a direction of arranging the memory cell array blocks on both sides of said memory cell array so that they constitute a single unit pattern; and a large number of said unit patterns are arranged, and said main bit lines are extended over said unit patterns so as to cross the direction of arranging said memory cell array blocks so that they are connected to the select transistor of each of said unit patterns.

4. A non-volatile semiconductor memory according to claim 2, wherein the select transistors arranged on the one side of each of said memory cell array blocks are connected to a common main bit line and the select transistors of the other side of each of said memory cell array blocks are connected to the main bit line adjacent thereto.

5. A non-volatile semiconductor memory according to claim 4, wherein at least one set of signal lines corresponding to each other arranged on both opposite sides of each of said memory cell array blocks are electrically connected to each other, and the same control signal can be applied to each of the memory cells constituting each said memory cell array blocks from both sides.

6. A non-volatile semiconductor memory according to claim 2, wherein said signal lines are adjacent to another set of signal lines designed to be able to be connected to another memory cell array block adjacent to the memory cell array block at issue.

7. A non-volatile semiconductor memory comprising:

a memory cell array including a plurality of non-volatile memory cells, and connected to a plurality of word lines and a plurality of bit lines, respectively;

a row decoder for selecting said word lines on the basis of row address data; and a column decoder for selecting said bit lines on the basis of column address data; wherein said bit lines include a plurality of main bit lines connected to said column decoder and a plurality of split bit lines each connected to each of said plurality of main bit lines through each of a plurality of select transistors to determine which of the split bit lines is to be selected; and the split bit lines connected to a first main bit line and a second main bit line arranged adjacently thereto are arranged alternately adjacent to each other, wherein two split bit lines are connected to each of said main bit lines, wherein said main bit lines are electrode wirings interlayer-insulated from said split bit lines, a convex portion which partially protrudes from one side of each said electrode wirings is arranged at an area to which said select transistor is to be connected; and the convex portion of one main bit line is opposite to that of another main bit line adjacent thereto.

8. A non-volatile semiconductor memory comprising:

a memory cell array including a plurality of non-volatile memory cells, and connected to a plurality of word lines and a plurality of bit lines, respectively;

a row decoder for selecting said word lines on the basis of row address data; and a column decoder for selecting said bit lines on the basis of column address data; wherein said bit lines include a plurality of main bit lines connected to said column decoder and a plurality of split bit lines each connected to each of said plurality of main bit lines through each of a plurality of select transistors to determine which of the split bit lines is to be selected; and the split bit lines connected to a first main bit line and a second main bit line arranged adjacently thereto are arranged alternately adjacent to each other, wherein two split bit lines are connected to each of said main bit lines, wherein said plurality of unit patterns are arranged on a semiconductor substrate surface, and each said plurality of unit patterns comprises:

a memory cell array block including split-type memory cells arranged in a matrix;

select transistors arranged on both sides of each said memory cell array blocks in their arranging direction;

discharge transistors arranged outside the select transistors; and three pairs of electrode wirings travelling in parallel to a direction of arranging the memory cells outside the discharge transistors.

9. A non-volatile semiconductor memory according to claim 7, wherein the split bit lines are arranged over and orthogonally to the electrode wirings through an interlayer insulating film.

10. A non-volatile semiconductor memory according to claim 9, wherein said three pairs of electrode wirings are a grounding potential line, a write enable potential line and a write disable potential line arranged in order outward from the side of the memory cells.

11. A non-volatile semiconductor memory according to claim 10, wherein said write enable potential line and write disable potential line are located at a complementary signal potential.

12. A non-volatile semiconductor memory according to claim 8, wherein said row decoder is arranged along the one side of a peripheral region of said semiconductor substrate, and said column decoder is arranged along another side orthogonal to the one side.

13. A non-volatile semiconductor memory according to claim 12, wherein said column decoder is formed to extend in a direction orthogonal to said signal lines.

* * * * *